(12) United States Patent
Xing (10) Patent No.: US 11,056,888 B2
(45) Date of Patent: Jul. 6, 2021

(54) METHOD, APPARATUS, AND COMPUTER READABLE STORAGE MEDIUM FOR ELECTRICAL ISLANDING DETECTION

(71) Applicant: Schneider Electric Industries SAS, Rueil-Malmaison (FR)

(72) Inventor: Jinlei Xing, Shanghai (CN)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 402 days.

(21) Appl. No.: 16/021,157

(22) Filed: Jun. 28, 2018

(65) Prior Publication Data
US 2019/0006849 A1    Jan. 3, 2019

(30) Foreign Application Priority Data
Jun. 30, 2017  (CN) .......................... 201710521026.4

(51) Int. Cl.
*H02J 3/38*      (2006.01)
*G01R 31/28*    (2006.01)
(Continued)

(52) U.S. Cl.
CPC ............ *H02J 3/381* (2013.01); *G01R 19/175* (2013.01); *G01R 31/086* (2013.01); *G01R 31/2837* (2013.01); *H02J 9/06* (2013.01); *H02J 3/388* (2020.01)

(58) Field of Classification Search
CPC ... H02J 3/381; G01R 31/2837; G01R 19/175; G01R 31/086
See application file for complete search history.

(56) References Cited

U.S. PATENT DOCUMENTS

| 9,478,966 B2 | 10/2016 | Vanhala et al. |
| 10,031,168 B2 | 7/2018 | Juvonen et al. |

(Continued)

FOREIGN PATENT DOCUMENTS

| CN | 103636095 A | 3/2014 |
| CN | 103901295 A | 7/2014 |

(Continued)

OTHER PUBLICATIONS

Extended European Search Report for European Patent Application No. 18305825.4 dated Dec. 10, 2018, 13 pages.

(Continued)

*Primary Examiner* — Manuel A Rivera Vargas
(74) *Attorney, Agent, or Firm* — Locke Lord LLP (57) ABSTRACT

The present invention provides method, apparatus, and computer readable storage medium for an electrical islanding detection. The method for electrical islanding detection method includes: receiving a three-phase voltage in an electrical power system; for the three-voltage voltage, calculating a voltage angle sudden-change of each phase, respectively; determining whether an absolute value of the voltage angle sudden-change of each phase is greater than a first angle sudden-change setting value; determining whether directions of the voltage angle sudden-changes of three phase are the same if the absolute value of the voltage angle sudden-change of each phase is greater than the first angle sudden-change setting value; and determining that the electrical islanding appears if the directions of the voltage angle sudden-changes of the three phases are the same.

20 Claims, 5 Drawing Sheets

(51) Int. Cl.
  *G01R 19/175* (2006.01)
  *G01R 31/08* (2020.01)
  *H02J 9/06* (2006.01)

(56) References Cited

U.S. PATENT DOCUMENTS

| | | | | |
|---|---|---|---|---|
| 10,041,985 | B2 | 8/2018 | Suomi | |
| 2003/0147191 | A1* | 8/2003 | Deng | H02J 3/38 361/62 |
| 2011/0309690 | A1* | 12/2011 | West | H02J 3/383 307/125 |
| 2017/0237256 | A1* | 8/2017 | Majumder | H02J 3/06 307/80 |

FOREIGN PATENT DOCUMENTS

| | | |
|---|---|---|
| CN | 103983898 A | 8/2014 |
| CN | 104730396 A | 6/2015 |
| CN | 104950194 A | 9/2015 |
| CN | 104734176 B | 9/2016 |
| CN | 106154078 A | 11/2016 |
| CN | 106199228 A | 12/2016 |
| EP | 2538517 | 12/2012 |
| EP | 2645517 | 10/2013 |

OTHER PUBLICATIONS

English Language Machine Translation of Chinese Patent Application Publication No. CN106199228A, published on Dec. 7, 2016, 20 pages.

English Language Machine Translation of Chinese Patent Application Publication No. CN104734176B, published on Sep. 21, 2016, 12 pages.

English Language Machine Translation of Chinese Patent Application Publication No. CN103983898A, published on Aug. 13, 2014, 4 pages.

Massoud, A.M, et al., "Harmonic distortion-based island detection technique for inverter-based distributed generation", IET Renew. Power Gener., vol. 3, Issue 4, pp. 493-507, 2009.

Office Action for Chinese Patent Application No. CN201710521026.4 dated Jun. 1, 2020, 14 pages.

English Language Translation of Office Action for Chinese Patent Application No. CN201710521026.4 dated Jun. 1, 2020, 9 pages.

English Language Translation of Abstract of Chinese Patent Application Publication No. CN106154078A published on Nov. 23, 2016, 1 page.

English Language Translation of Abstract of Chinese Patent Application Publication No. CN104730396A published on Jun. 24, 2015, 1 page.

English Language Translation of Abstract of Chinese Patent Application Publication No. CN103901295A published on Jul. 2, 2014, 1 page.

English Language Translation of Abstract of Chinese Patent Application Publication No. CN103636095 published on Mar. 12, 2014, 1 page.

English Language Translation of Abstract of Chinese Patent Application Publication No. CN104950194A published on Sep. 30, 2015, 1 page.

\* cited by examiner

METHOD, APPARATUS, AND COMPUTER READABLE STORAGE MEDIUM FOR ELECTRICAL ISLANDING DETECTION

This application claims the benefit under 35 U.S.C. § 119 of Chinese Patent Application No. 201710521026.4, filed on Jun. 30, 2017, the entire contents of which are hereby incorporated herein by reference as a part of the present application.

TECHNICAL FIELD OF THE DISCLOSURE

The present disclosure relates to the field of electrical islanding detection, and more particular, to a method, apparatus, and computer readable storage medium for electrical islanding detection.

BACKGROUND

In recent years, distributed generation (DG) has been rapidly developed in electrical power systems, causing new challenges to protection of the conventional distribution networks, for example, there is a need to prevent unintentional electrical islanding from occurring. Unintentional electrical islanding may endanger personal safety, and lead to problems such as closing failure, degradation of power quality and the like. An important requirement for electrical power devices, such as grid-connected inverters of distributed generation, grid-connected relay protection apparatuses and the like, is to detect the islanding phenomenon within 2 seconds after the electrical islanding occurs unintentionally.

At present, there are several methods for electrical islanding detection on the market, which may be classified into active methods and passive methods. According to the active methods, the control scheme of a distributed generation is modified so that the output voltage or frequency is periodically disturbed, and the power grid and the electrical islanding state are distinguished from each other by detecting the disturbance of the voltage or frequency. However, the active methods have certain adverse impacts on power quality, and when there are multiple distributed generations interacting with each other in the electrical power system, the effectiveness of the active methods on islanding detection decreases. The passive methods, such as under frequency, over frequency, under voltage, over voltage protection and the like, are relatively simple and have no impact on power quality. However, the passive methods have a comparatively large "non-detection zone". When the internal power of the electrical islanding is completely or nearly balanced, the passive methods cannot detect the electrical islanding or needs a relatively long delay to detect the electrical islanding. The rate of change of frequency (ROCOF) and the voltage vector shift (VVS) are two commonly used passive methods. These two methods are relatively sensitive, but in the case that the electrical power system faults, methods for islanding detection based on the rate of change of frequency or the voltage vector shift may mal-operate. In addition, a method for islanding detection based on communication issues a trip command directly to the distributed generation when a switch for the main power grid trips. This method has high reliability without "non-detection zone", however, such a method requires a special communication network and has a relatively high cost.

In summary, currently, there is a lack of a sensitive, reliable, and economical electrical islanding detection solution in the market.

SUMMARY

In view of the above, the present disclosure provides a method, an apparatus, and computer readable storage medium for electrical islanding detection, which can detect the electrical islanding sensitively and accurately at a low cost while effectively reduce the possibility that mal-operations occur in the case that an electrical power system fails.

According to one aspect of the present disclosure, there is provided a method for electrical islanding detection, the method comprising: receiving a three-phase voltage in an electrical power system; for the three-voltage voltage, calculating a voltage angle sudden-change of each phase, respectively; determining whether an absolute value of the voltage angle sudden-change of each phase is greater than a first angle sudden-change setting value; determining whether directions of the voltage angle sudden-change of the three phase are the same if the absolute value of the voltage angle sudden-change of each phase is greater than the first angle sudden-change setting value; and determining that the electrical islanding appears if the directions of the voltage angle sudden-changes of the three phase are the same.

According to another aspect of the present invention, there is provided a method for electrical islanding detection, comprising: receiving a three-phase voltage in an electrical power system; determining that the electrical power system enters into a three-phase voltage abnormal state if the three-phase voltage meets any one of the following conditions comprising: a zero sequence voltage is greater than a zero sequence voltage setting value; or a magnitude of any phase voltage is less than a voltage setting value; or an absolute value of the voltage angle sudden-change of any phase between adjacent voltage cycles is greater than an angle sudden-change setting value; determining that the electrical power system enters into a three-phase voltage normal state if none of the above conditions is met and a real-time measurement value of the rate of change of frequency is less than a setting value of the rate of change of frequency; when the electrical power system enters into the three-phase voltage abnormal state, calculating an accumulated voltage angle change of the three-phase voltage based on the real-time frequency measurement value; determining whether the accumulated voltage angle change is greater than an accumulated angle change setting value; and determining that the electrical islanding appears if the accumulated voltage angle change is greater than the accumulated angle change setting value, wherein when the electrical power system enters into the three-phase voltage normal state, the calculation of the accumulated voltage angle change is stopped.

According to a further aspect of the present invention, there is provided an apparatus for electrical islanding detection, comprising: a voltage reception unit for receiving a three-phase voltage in an electrical power system; a first calculation unit for, for the three-voltage voltage, calculating a voltage angle sudden-change of each phase, respectively; a first determination unit for determining whether an absolute value of the voltage angle sudden-change of each phase is greater than a first angle sudden-change setting value; a second determination unit for determining whether directions of the voltage angle sudden-change of the three phase are the same if the absolute value of the voltage angle sudden-change of each phase is greater than the first angle sudden-change setting value; and a third determination unit for determining that the electrical islanding appears if the directions of the voltage angle sudden-changes of the three phases are the same.

According to still another aspect of the present invention, there is provided an apparatus for electrical islanding detection, comprising: a voltage reception unit for receiving a three-phase voltage in an electrical power system; a first determination unit for determining that the electrical power system enters into a three-phase voltage abnormal state if the three-phase voltage meets any one of the following conditions comprising: a zero sequence voltage is greater than a zero sequence voltage setting value; or a magnitude of any phase voltage is less than a voltage setting value; or an absolute value of the voltage angle sudden-change of any phase between adjacent voltage cycles is greater than an angle sudden-change setting value; determining that the electrical power system enters into a three-phase voltage normal state if none of the above conditions is met and a real-time measurement value of the rate of change of frequency is less than a setting value of the rate of change of frequency; a calculation unit for, when the electrical power system enters into the three-phase voltage abnormal state, calculating an accumulated voltage angle change of the three-phase voltage based on the real-time frequency measurement value; a second determination unit for determining whether the accumulated voltage angle change is greater than an accumulated angle change setting value; and a third determination unit for determining that the electrical islanding appears if the accumulated voltage angle change is greater than the accumulated angle change setting value, wherein when the electrical power system enters into the three-phase voltage normal state, the calculation unit stops the calculation of the accumulated voltage angle change.

According to another aspect of the present invention, there is provided a computer readable storage medium storing thereon a computer program which implements, when executed by a processor, the following steps of: receiving a three-phase voltage in an electrical power system; for the three-voltage voltage, calculating a voltage angle sudden-change of each phase, respectively; determining whether an absolute value of the voltage angle sudden-change of each phase is greater than a first angle sudden-change setting value; determining whether directions of the voltage angle sudden-changes of the three phases are the same if the absolute value of the voltage angle sudden-change of each phase is greater than the first angle sudden-change setting value; and determining that the electrical islanding appears if the directions of the voltage angle sudden-changes of the three phases are the same.

According to another aspect of the present invention, there is provided a computer readable storage medium storing thereon a computer program which implements, when executed by a processor, the following steps of: receiving a three-phase voltage in an electrical power system; determining that the electrical power system enters into a three-phase voltage abnormal state if the three-phase voltage meets any one of the following conditions comprising: a zero sequence voltage is greater than a zero sequence voltage setting value; or a magnitude of any phase voltage is less than a voltage setting value; or an absolute value of the voltage angle sudden-change of any phase between adjacent voltage cycles is greater than an angle sudden-change setting value; determining that the electrical power system enters into a three-phase voltage normal state if none of the above conditions is met and the real-time measurement value of the rate of change of frequency is less than a setting value of the rate of change of frequency; when the electrical power system enters into the three-phase voltage abnormal state, calculating an accumulated voltage angle change of the three-phase voltage based on the real-time frequency measurement value; determining whether the accumulated voltage angle change is greater than an accumulated angle change setting value; and determining that the electrical islanding appears if the accumulated voltage angle change is greater than the accumulated angle change setting value, wherein when the electrical power system enters into the three-phase voltage normal state, the calculation of the accumulated voltage angle change is stopped.

In the electrical islanding detection method, apparatus and computer readable storage medium according to the embodiments of the present invention, by improving the existing VVS-based method for islanding detection, the electrical islanding can be detected sensitively, accurately, and reliably at the low cost.

BRIEF DESCRIPTION OF THE DRAWINGS

In order to more clearly explain the technical schemes of the embodiments of the present disclosure, the accompanying drawings used in the description of the embodiments will be briefly illustrated below. The accompanying drawings in the following description are merely exemplary embodiments of the present disclosure.

DETAILED DESCRIPTION

Hereinafter, preferred embodiments of the present invention will be described in detail with reference to the accompanying drawings. Note that, in this specification and the accompanying drawings, substantially the same steps and elements are denoted with the same reference numerals, and repeated explanation of these steps and elements will be omitted.

As mentioned above, at present, there is a lack of an ideal islanding detection solution which is capable of meeting requirements of both reliability and economy in the market. Although the existing voltage vector shift (VVS)-based method for islanding detection has simple implementation and good economy, this method cannot reliably distinguish between the electrical islanding and system faults, and thus, mal-operations sometimes occur. More specifically, the conventional VVS-based method for islanding detection cannot effectively distinguish between "voltage vector shift caused by the suddenly-occurred electrical islanding" and "voltage vector shift caused by an electrical power system fault", and the setting value of the angular deviation is relatively great, the sensitivity for the electrical islanding detection is not high enough. Here, it should be noted that, setting value is a fixed value that may be preset according to a specific situation. The setting value can also be generally referred to as a setting-up value in the art, meaning that in the automatic control system, when a certain physical quantity reaches a certain value, an action will occur.

In order to improve the existing VVS-based method for islanding detection, the present disclosure is based on a principle that three-phase voltage vectors shift in the same direction due to power imbalance within the electrical island at the moment that the electrical islanding occurs, while the three-phase voltage vectors do not shift in the same direction at the moment that an imbalanced fault occurs in the electrical power system. This principle is applied to the islanding detection for the first time.

FIGS. 1A-1D show schematic diagrams of voltage phase changes caused by imbalanced faults of the electrical power system and the suddenly-occurred electrical islanding, respectively.

In FIGS. 1A-1D, solid arrows labeled with A, B, and C indicate the states of three-phase voltage vectors before a fault occurs, dotted arrows indicate the states of respective three-phase voltage vectors after the fault occurs, and curved arrows indicate the rotation directions of the voltage vectors.

Figure 1A:
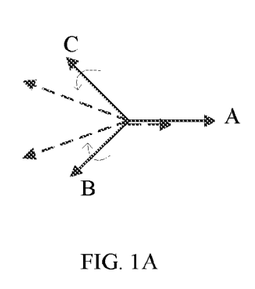
FIGS. 1A-1D respectively show schematic diagrams of voltage phase changes caused by the electrical power system faults and the suddenly-occurred electrical islanding.
Figure 1B:
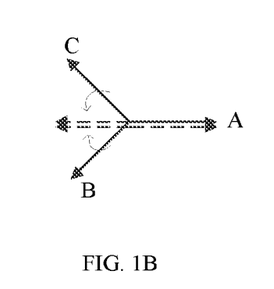
Figure 1C:
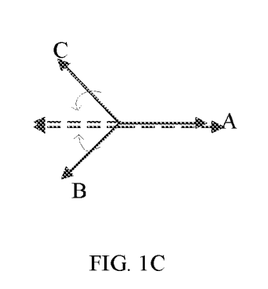

Specifically, FIGS. 1A to 1C show voltage phase changes (i.e., voltage vector shifts) caused by imbalanced faults of the electrical power system, respectively. More specifically, FIG. 1A shows shifts of three-phase voltage vectors A, B, and C when a ground fault occurs in the single phase A. As shown in FIG. 1A, the angle of the phase voltage A does not change (i.e., no rotation occurs) and the magnitude thereof decreases, the magnitudes of the phase voltages B and C increase, and meanwhile phase voltages B and C rotate/shift clockwise and counterclockwise, respectively. FIG. 1B shows shifts of the three-phase voltage vectors A, B, and C when a two-phase fault occurs between phase voltages B and C. As shown in FIG. 1B, the magnitude and the angle of the phase voltage A do not change, the magnitudes of the phase voltages B and C decrease, and phase voltages B and C rotate clockwise and counterclockwise, respectively. FIG. 1C shows shifts of three-phase voltage vectors A, B, and C when ground faults occur in phase voltages B and C. As shown in FIG. 1C, the angle of the phase voltage A does not change (i.e., no rotation occurs) and the magnitude of the phase voltage A increases; while the magnitudes of the phase voltages B and C do not change, but phase voltages B and C rotate clockwise and counterclockwise, respectively.

It can be seen from the voltage phase changes as shown in FIGS. 1A to 1C that the three-phase voltage vectors do not all shift in one direction in the event of imbalanced faults of the electrical power system.

Figure 1D:
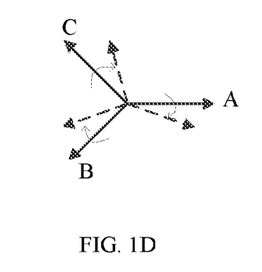

FIG. 1D schematically shows a possible example of voltage phase changes (i.e., voltage vector shifts) caused by electrical islanding. As shown in FIG. 1D, the three-phase voltage vectors A, B, and C all shift clockwise, and all decrease in magnitude.

Comparing FIG. 1D with FIGS. 1A to 1C, it is not difficult to find that the three-phase voltage vector shifts caused by the imbalanced fault of the electrical power system are not all in the same direction while the three-phase voltage vectors shifts caused by the electrical islanding are all in the same direction.

It should be understood that FIG. 1D is merely an illustrative example of the phase changes of the three-phase voltage caused by the electrical islanding to facilitate comparing with the voltage phase changes caused by imbalanced faults of the electrical power system as shown in FIGS. 1A to 1C. It is well known to those skilled in the art that other possible situations different from FIG. 1D may also occur for the three-phase voltage vector shifts caused by the electrical islanding. For example, the changes in magnitudes of the three-phase voltage vectors A, B, and C may be different depending on specific situations, and the rotation/shift angles of the three-phase voltage vectors A, B, and C may also be different, and so on. However, when the electrical islanding occurs, the three-phase voltage vectors A, B, and C all rotate/shift clockwise or counterclockwise, which is different from the situation when an imbalanced fault of the electrical power system occurs and which is also the principle on which the present disclosure is based.

Figure 2:
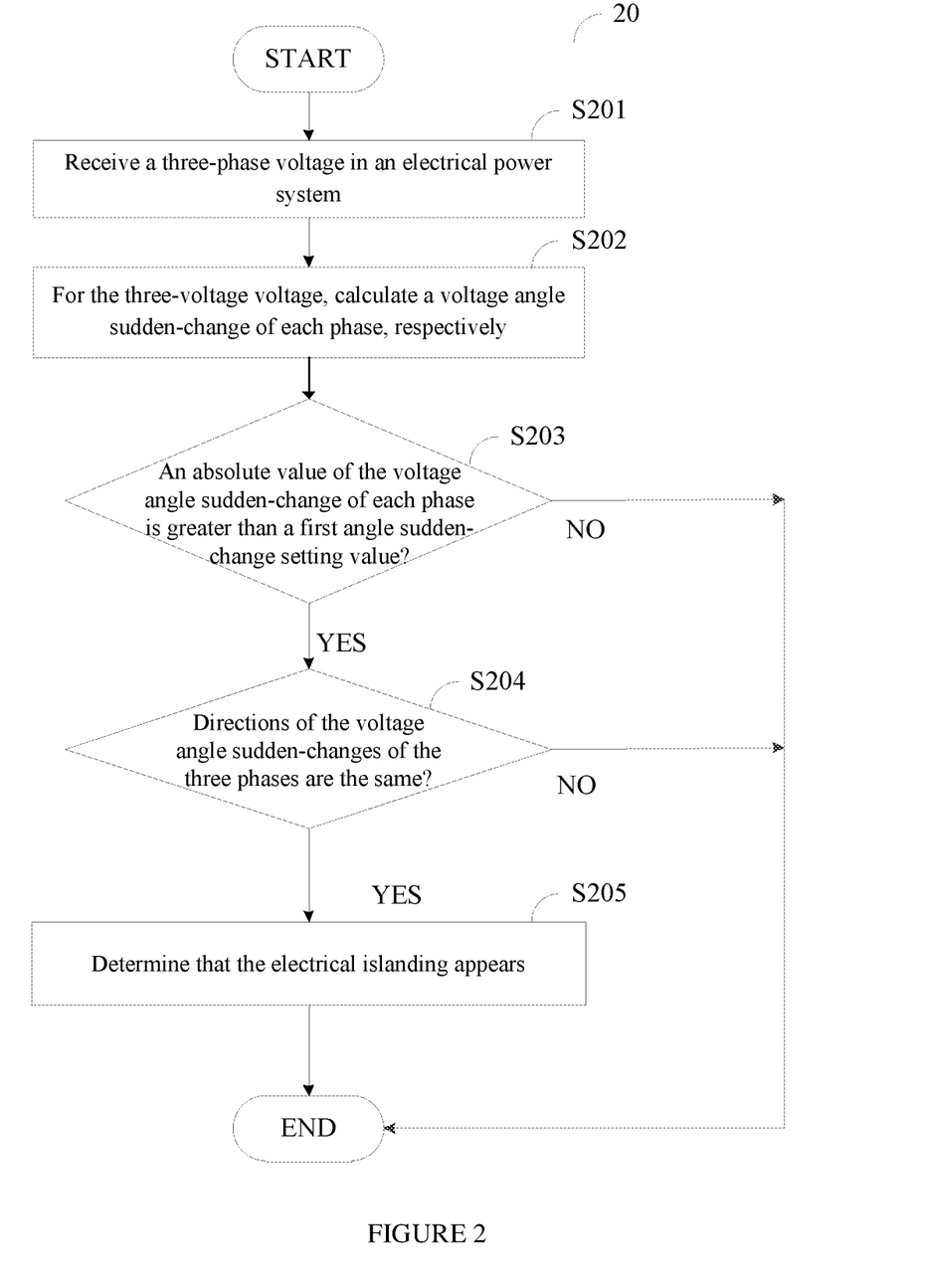
FIG. 2 is a flowchart illustrating a method for electrical islanding detection according to an embodiment of the present disclosure.

In the following, a method 20 for electrical islanding detection according to an embodiment of the present disclosure will first be described with reference to FIG. 2. FIG. 2 is a flowchart illustrating a method 20 for electrical islanding detection according to an embodiment of the present disclosure. The method 20 for electrical islanding detection can be applied to various electrical power systems that the electrical islanding may occur, which is known to those skilled in the art.

As shown in FIG. 2, at the beginning of the method 20 for electrical islanding according to the embodiment of the present disclosure, first, at step S201, a three-phase voltage in an electrical power system is received. Next, at step S202, for the three-phase voltage, the voltage angle sudden-change of each phase is calculated, respectively. Then, at step S203, it is determined whether the absolute value of the voltage angle sudden-change of each phase is greater than a first angle sudden-change setting value. If the determination result in step S203 is "YES", then at step S204, it is determined whether directions of the voltage angle sudden-changes of the three phases are the same. If the determination result in step S204 is "YES", then at step S205, it is determined if the electrical islanding occurs. After the step S205 is performed, the method 20 for electrical islanding detection ends.

Specifically, in the above-described step S201, for example, the three-phase voltage may be received at the secondary side of a voltage transformer in the electrical power system, that is, the three-phase voltage transformed by the voltage transformer is received. The method 20 for electrical islanding detection according to the embodiment of the present disclosure is passive islanding detection and only requires three-phase voltage input, as a result, a low cost is achieved.

In the above-described step S202, the specific calculation manner of the voltage angle sudden-changes can be determined according to specific system requirements and system performance. For example, if the system's computing capability is limited and the calculation accuracy is not required to be high, then a simple manner with a small amount of calculation may be used to perform calculation; otherwise, if the system has a high computing capability and there is a high requirement for calculation accuracy, then a complex manner with a large amount of calculation may be used to perform calculation. Different calculation manners of the voltage angle sudden-changes will be described in detail later by way of example.

Note that, as it is well-known to those skilled in the art, the voltage angle sudden-change herein can also be referred to as an angle of a voltage vector shift, a voltage angle change, an angle difference, and the like.

In the above-described step S203, the first angle sudden-change setting value is a fixed value which can be preset according to a specific situation, and the range thereof is generally between 1° and 20°.

Existing voltage vector shift (VVS)-based methods for islanding detection in the art generally also employ step S203, and only employ step S203 to determine whether the electrical islanding occurs. That is, in the existing VVS-based methods for islanding detection in the arts, as long as the absolute value of the voltage angle sudden-change of each phase is greater than the first angle sudden-change setting value, it is judged that the electrical islanding appears. This results in being unable to effectively distinguish between "voltage vector shift caused by the sudden electrical islanding" and "voltage vector shift caused by an electrical power system fault", and therefore, mal-operations occur at times. In addition, in the existing methods for islanding detection in the art, in order to reduce mal-operations, the setting value of the angular deviation is relatively great (for example, usually about 10°), and the detection sensitivity for the electrical islanding is not high enough.

In the present disclosure, the above-described step S204 is incorporated as a further criterion for the first time, therefore, when the voltage angle sudden-changes of the respective phases are in the same direction, it is determined that the electrical islanding occurs. As described above with reference to FIGS. 1A-1D, if the directions of the voltage angle sudden-changes of respective phases are not all the same, an imbalanced fault of the electrical power system instead of the electrical islanding occurs at this time. Therefore, even if the determination condition in step S203 is satisfied, it may not be appropriate to determine that the electrical islanding occurs. According to the present disclosure, it is determined that the electrical islanding occurs when the determination conditions of steps S203 and S204 are both satisfied. In this way, it is possible to effectively distinguish between "the sudden electrical islanding" and "the imbalanced fault of the electrical power system", which improves the accuracy of the determination. Thus, in the present disclosure, the setting value of the angular deviation (i.e., the first angle sudden-change setting value) is relatively small (for example, may be about 4°), and the electrical islanding can be detected more sensitively.

It should be understood that the execution order of the two determination steps S203 and S204 is not limited to the manner shown in FIG. 2, and steps S203 and S204 may be performed in other orders or may be performed in parallel. As long as the results of the two determination steps are both positive, it may be determined at step S205 that the electrical islanding occurs.

In the method 20 for electrical islanding detection according to the embodiment of the present disclosure as described above with reference to FIG. 2, by further considering whether the directions of the voltage angle sudden-changes of the respective phases are the same or not as one of the criteria for determining whether the electrical islanding occurs, the present disclosure, compared with the conventional VVS-based method for islanding detection, can detect the electrical islanding more sensitively and accurately while effectively reduce the possibility that mal-operations occur in the case that the electrical power system fails.

Alternatively, although not shown in FIG. 2, step S204 may further include a sub-step of determining whether an absolute value of the average of the voltage angle sudden-changes of the three phases is greater than the first angle sudden-change setting value. And, if it is determined at the sub-step that the absolute value of the average of the voltage angle sudden-changes of the three phases is greater than the first angle sudden-change setting value, it is determined at step S205 that the electrical islanding appears.

Specifically, as shown in FIGS. 1A-1D, in an imbalanced fault of the electrical power system, there are usually two voltage vectors that are shifted in different directions, that is, the signs of the angle sudden-changes thereof are opposite. Therefore, in the case where step S203 is satisfied, the absolute value of the average of the voltage angle sudden-changes of the three phases caused by the imbalanced fault is often less than the first angle sudden-change setting value. On the contrary, in the case that the electrical islanding appears, since the three voltage vector shifts are all in the same direction, the signs of angle sudden-changes thereof are the same. Therefore, in the case where step S203 is satisfied, the absolute value of the average of the voltage angle sudden-changes of the three phases caused by the electrical islanding is inevitably greater than the first angle sudden-change setting value.

With the above alternative sub-step, the determination of whether the directions of the voltage angle sudden-changes of the three phases are same can be realized by determining whether the absolute value of the average of the voltage angle sudden-changes of the three phases is greater than the first angle sudden-change setting value. Thus, it is also possible to effectively distinguish between "voltage vector shifts caused by the suddenly-occur electrical islanding" and "voltage vector shifts caused by an electrical power system fault" to improve the accuracy of determination. Meanwhile, the implementation is relatively simple, the calculation amount is less, and the setting manner is also simple.

Further alternatively, although not shown in FIG. 2, step S202 may further include a sub-step of calculating a voltage angle sudden-change of each phase between adjacent voltage cycles respectively based on a zero-crossing detection.

Specifically, the voltage angle sudden-change refers to the voltage phase angle difference corresponding to a difference between two adjacent voltage cycles by continuously measuring voltage cycles using the zero-crossing detection method.

Note that since the zero-crossing detection is a simple measurement method for voltage frequency and cycle and is well known to those skilled in the art, it will not be described in detail herein to avoid confusing the inventive point of the present disclosure.

The above two alternative sub-steps can also be understood as a simple mode of the present disclosure. As mentioned above, the simple mode does not strictly confirm the exact shift direction of each phase voltage. Therefore, the implementation is simple, the amount of calculation is less, and the setting manner is also simple, however, the accuracy thereof is less improved.

In contrast to the simple mode, the present disclosure can also be implemented as an advanced mode for which the implementation is relatively complex, the amount of calculation is larger and the setting manner is also complicated. However, the advanced mode can obtain more accurate and stable detection results than the simple mode. In the following, the advanced mode of the present disclosure will be described in detail through the following alternative steps and/or sub-steps.

Alternatively, although not shown in FIG. 2, step S204 may further include a sub-step of determining whether signs of the voltage angle sudden-changes of the phases are the same. And, if it is determined in the sub-step that the signs of the voltage angle sudden-changes of the phases are the same, it is determined in step S205 that the electrical islanding appears.

Specifically, when the voltage vector of each phase rotates counterclockwise, the corresponding angle sudden-change is a positive value, and when the voltage vector of each phase rotates clockwise, the corresponding angle sudden-change is a negative value. As described hereinabove with reference to FIGS. 1A-1D, in the event of an imbalanced fault of the electrical power system, since rotation directions of at least two voltage vectors are different, the signs of their angle sudden-changes must be positive and negative, respectively. It can be seen that in the event of an imbalanced fault of the electrical power system, the signs of the voltage angle sudden-changes of respective phases cannot be all the same. On the contrary, in the event of the electrical islanding, since the rotation directions of the voltage vectors of the respective phases are all the same, all the signs of the angle sudden-changes thereof must be either positive or negative.

It can be seen that, with the above-described alternative sub-steps, the determination of whether the directions of the voltage angle sudden-changes of the three phases are the same is realized by determining whether the signs of the voltage angle sudden-changes of the respective phases are the same. Thus, it is also possible to effectively distinguish between "voltage vector shifts caused by the sudden electrical islanding" and "voltage vector shifts caused by an electrical power system fault" to improve the accuracy of determination. Compared with the above-described simple mode, the advanced mode needs to strictly confirm the exact shift direction of each phase voltage, and thus, the implementation is more complicated, while the obtained detection result is more accurate.

Further alternatively, although not shown in FIG. 2, the method 20 for electrical islanding detection according to an embodiment of the present disclosure may further include the following alternative steps subsequent to step S201: determining that the electrical power system enters into a three-phase voltage abnormal state if the three-phase voltage meets any one of the following conditions that: a zero sequence voltage is greater than a zero sequence voltage setting value; or a magnitude of any phase voltage is less than a voltage setting value; or the absolute value of the voltage angle sudden-change of any phase between adjacent voltage cycles is greater than a second angle sudden-change setting value, wherein, the second angle sudden-change setting value is less than the first angle sudden-change setting value; and determining that the electrical power system enters into a three-phase voltage normal state if none of the above conditions is met and a real-time measurement value of the rate of change of frequency is less than a setting value of the rate of change of frequency.

Figure 3:
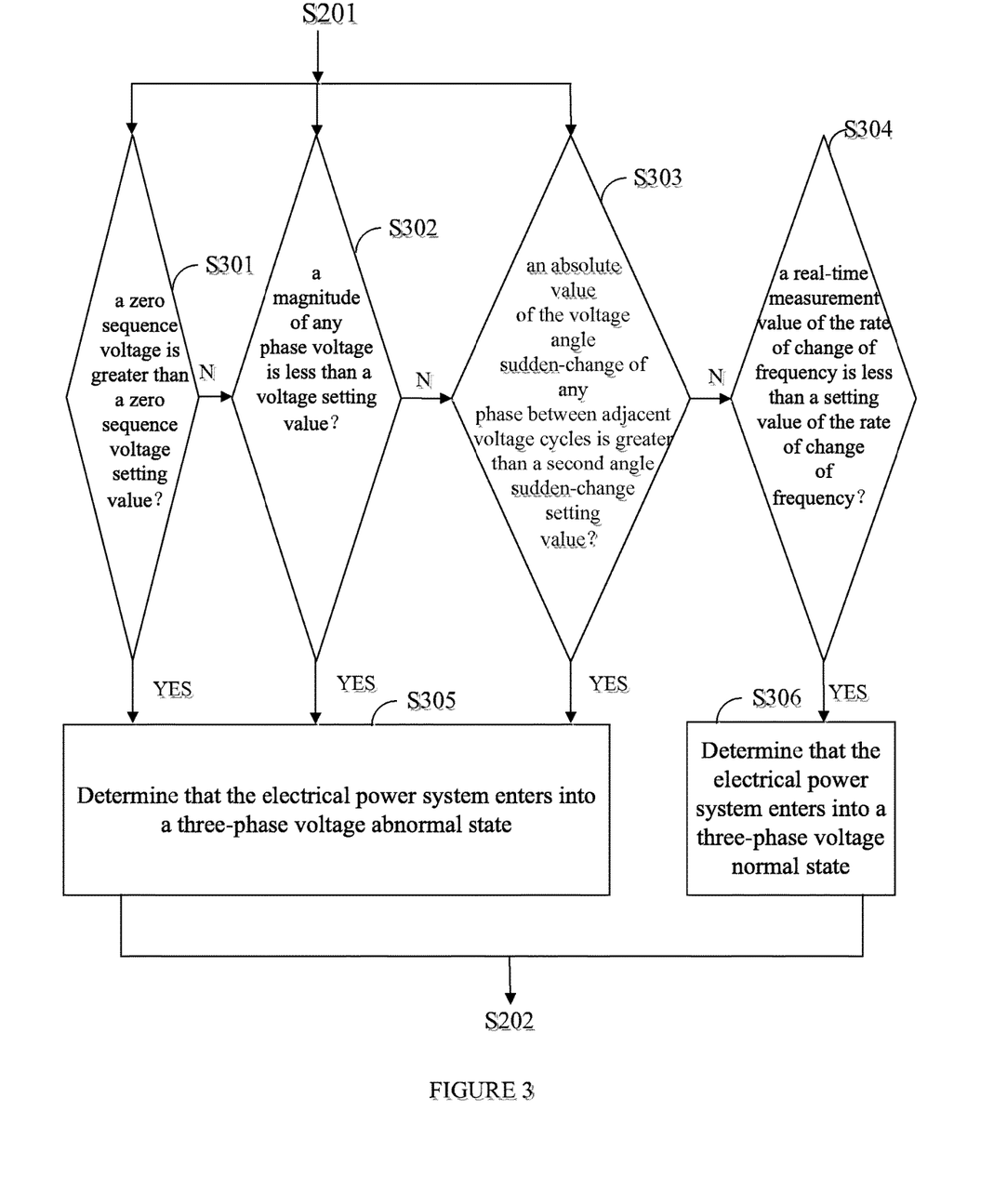
FIG. 3 is a flowchart illustrating alternative steps of a method for electrical islanding detection according to an embodiment of the present disclosure.

Specifically, the above-mentioned alternative steps are described in detail with reference to FIG. 3. FIG. 3 is a flowchart illustrating alternative steps of the method 20 for electrical islanding detection according to an embodiment of the present disclosure.

As shown in FIG. 3, after the three-phase voltage of the electrical power system is received at step S201, the method 20 for electrical islanding detection may proceed to alternative step S301 to determine whether the zero sequence voltage is greater than the zero sequence voltage setting value. If the determination result in step S301 is "YES", then it is determined at step S305 that the electrical power system enters into the three-phase voltage abnormal state. If the determination result in step S301 is "NO", then the method 20 proceeds to alternative step S302 to determine whether a magnitude of any phase voltage is less than the voltage setting value. If the determination result in the step S302 is "YES", then it is determined at step S305 that the electrical power system enters into the three-phase voltage abnormal state. If the determination result in step S302 is "NO", then the method 20 proceeds to alternative step S303 to determine whether the absolute value of the voltage angle sudden-change of any phase between adjacent voltage cycles is greater than the second angle sudden-change setting value. If the voltage result in step S303 is "YES", then it is determined at step S305 that the electrical power system enters into the three-phase voltage abnormal state. If the determination result in step S303 is "NO", then the method 20 proceeds to alternative step S304 to determine whether the real-time measurement value of the rate of change of frequency is less than the setting value of the rate of change of frequency. If the determination result in step S304 is "YES", then it is determined at step S306 that the electrical power system enters into the three-phase voltage normal state. After performing step S305 or the step S306, the method 20 may proceed to step S202.

More specifically, for example, it may be assumed that the zero sequence voltage setting value in step S301 is 10% of the voltage rating and the voltage setting value in step S302 is 80% of the voltage rating. However the present disclosure is not limited thereto, those skilled in the art may set appropriate setting values according to the specific situations.

In addition, it is assumed herein that the second angle sudden-change setting value is less than the first angle sudden-change setting value. That is, when the degree of power imbalance inside the electrical island is small, the instantaneous angle change of voltage may be less than the first angle sudden-change setting value but greater than the second angle sudden-change setting value, then it is considered that the three-phase voltage enters into an abnormal state according to the determination in step S303. It should be understood that, the relationship between the first angle sudden-change setting value and the second angle sudden-change setting value is not limited thereto, and those skilled in the art can set appropriate angle sudden-change setting values for determining whether the electrical power system enters into the three-phase voltage abnormal state according to practical requirements.

It should be noted that the execution order of the steps S301 to S303 is not limited to the order shown in FIG. 3, and the steps S301 to S303 may be performed in any suitable orders. As long as any one of them has a determination result of "YES", it is considered that the electrical power system enters into the three-phase voltage abnormal state.

It should be understood that although not shown in FIG. 3, if the determination result at step S304 is "NO", that is, when the determination condition of the three-phase voltage normal state is not satisfied, the current state can be maintained. For example, if it has been previously determined that the electrical power system enters into the three-phase voltage abnormal state, then when the determination result at step S304 is "NO", it is considered that the electrical power system is still in the three-phase voltage abnormal state, and it is determined that the electrical power system enters into the three-phase voltage normal state when the determination result at step S304 is "YES". For another example, if it has been previously determined that the electrical power system enters into the three-phase voltage normal state, then when the determination result at step S304 is "NO", it is considered that the electrical power system is still in the three-phase voltage normal state.

In addition, it should be understood that the alternative steps shown in FIG. 3 are merely illustrative examples and the invention is not limited thereto. The alternative steps in FIG. 3 may also be performed after, in parallel with, or in combination with step S202 in the method 20 for electrical islanding detection shown in FIG. 2.

Further alternatively, although not shown in FIG. 2, the method 20 for electrical islanding detection according to the embodiment of the present disclosure may further include, after step S201, an alternative step of calculating a voltage phase angle of each voltage cycle using the Fourier Transform. In addition, step S202 may include a sub-step of calculating a voltage angle sudden-change of each phase based on a last stable angle, the last stable angle is updated with the latest calculated voltage phase angle in the three-phase voltage normal state, and the last stable angle is kept unchanged in the three-phase voltage abnormal state.

Here, using the Fourier Transform to calculate the phase angle and the magnitude of the voltage is a technique well-known to those skilled in the art, and therefore, it will not be explained in detail herein to avoid confusing the inventive point of the present disclosure.

Specifically, as described above, in the present disclosure, when it is determined by the additional alternative steps shown in FIG. 3 that the electrical power system enters into the three-phase voltage normal state, for each voltage cycle, the last stable angle is updated with the voltage phase angle in the current voltage cycle that is calculated using the Fourier Transform. When it is determined that the electrical power system enters into the three-phase voltage abnormal state, the last stable angle is no more updated during the abnormal state, and is kept unchanged. For example, assuming that it is determined at time t0 that the electrical power system enters into the three-phase voltage abnormal state, then during the abnormal state, the last stable angle is maintained as the latest stable angle at time t0, and when it is determined that the electrical power system enters into the three-phase voltage normal state again, the last stable angle is began to be updated every voltage cycle.

Calculating the voltage angle sudden-change of each phase based on the last stable angle specifically means that: comparing the calculated voltage phase angle in the current voltage cycle with the last stable angle, and the difference between the calculated voltage phase angle in the current voltage cycle and the last stable angle is the voltage angle sudden-change. More specifically, during a period when the electrical power system is in the three-phase voltage abnormal state, since the last stable angle remains as the latest stable angle at the time when the electrical power system enters into the three-phase voltage abnormal state as described above, the voltage phase angle calculated every voltage cycle subsequently is compared with the last stable angle to calculate the voltage angle sudden-change. In addition, during a period when the electrical power system is in the three-phase voltage normal state, for every voltage cycle, the voltage angle sudden-change is calculated first, and then the last stable angle is updated. For example, it is assumed that there are two adjacent voltage cycles T1 and T2, and the voltage cycle T2 is the current voltage cycle. During the voltage cycle T2, the voltage phase angle in the current voltage cycle T2 is first calculated using Fourier Transform. Then, the calculated voltage phase angle is compared with the last stable angle in order to calculate the voltage angle sudden-change of in the current voltage cycle T2. Here, the last stable angle is the voltage phase angle calculated using the Fourier Transform in the voltage cycle T1, that is, in the voltage cycle T1, the last stable angle is updated with the voltage phase angle calculated in this voltage cycle. Finally, the last stable angle is updated with the voltage phase angle calculated in voltage cycle T2 for use for subsequent voltage cycles.

In the advanced mode of the present disclosure, as described above, the last stable angle is defined, and the voltage angle sudden-change of each phase is calculated based on the last stable angle, which is different from the current conventional VVS-based method for islanding detection. In the current conventional VVS-based method for islanding detection, calculation of the voltage angle sudden-change is always based on the voltage angles of adjacent two power cycles (that is, adjacent two voltage cycles). By utilizing the above alternative steps and sub-steps, that is, by incorporating the last stable angle, the present invention improves the accuracy and stability of detection compared with the conventional VVS-based method for islanding detection.

Further alternatively, in the method 20 for electrical islanding detection according to the embodiment of the present disclosure, when the time period during which the last stable angle is kept unchanged in the three-phase voltage abnormal state is greater than an effective time limit setting value of the last stable angle, the method for electrical islanding detection is blocked until the electrical power system enters into the three-phase voltage normal state.

Specifically, if the electrical power system is always in the three-phase voltage abnormal state, then the last stable angle is never updated. If the time period during which the last stable angle is not updated is too long, then the last stable angle may fail, resulting in incorrect detection results. Therefore, an effective time limit setting value of the last stable angle can be set, for example, as 2 seconds. When the time period that the last stable angle is kept unchanged in the three-phase voltage abnormal state is greater than the effective time limit setting value, the method 20 for electrical islanding detection is blocked, that is, the detection result is not output, thereby avoiding outputting the erroneous detection result. When the electrical power system enters into the three-phase voltage normal state again, the last stable angle can be updated in real time, and thus the method 20 for electrical islanding detection operates again.

As described above, the simple mode of the present disclosure has simple implementation, a small amount of calculation, and a simple setting manner, but has a relatively poor accuracy. The advanced mode of the present disclosure has relatively complex implementation, a large amount of calculation, and a more complex setting manner, while can obtain a more accurate and stable detection effect. It should be noted that the simple mode and the advanced mode of the present disclosure are not differentiated by strict application scenarios, and those skilled in the art can make choices according to practical needs.

Alternatively, in the method 20 for electrical islanding detection according to the embodiment of the present invention, the three-phase voltage can be three-phase-to-phase voltage. However, the present disclosure is not limited thereto, and the present disclosure may also employ a three-phase-to-ground voltage. However, it is preferably to employ three-phase-to-phase voltage than to employ a three-phase-to-ground voltage.

The method 20 for electrical islanding detection according to one embodiment of the present invention is described above with reference to FIGS. 1-3. In the method 20 for electrical islanding detection, by further considering whether the directions of the voltage angle sudden-changes of the phases are the same or not as one of the criteria for determining whether the electrical islanding appears, the present disclosure, compared with the conventional VVS-based method for islanding detection, can detect the electrical islanding more sensitively and accurately while effectively reduce the possibility that mal-operations occur in the case that the electrical power system fails.

Figure 4:
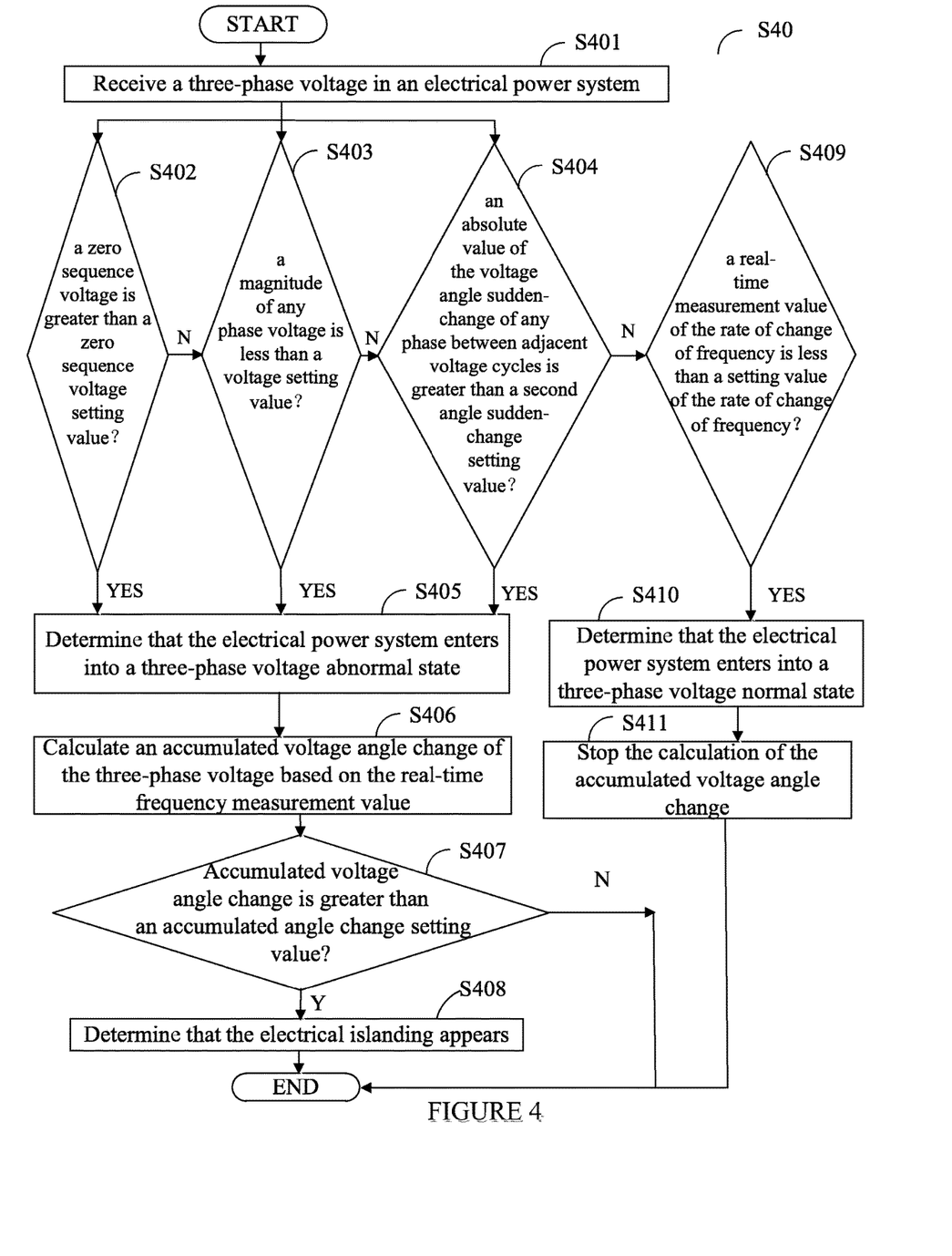
FIG. 4 is a flowchart illustrating a method for electrical islanding detection according to another embodiment of the present disclosure.

Although in the method 20 for electrical islanding detection shown in FIG. 2, "voltage vector shifts caused by the suddenly-occur electrical islanding" and "voltage vector shifts caused by an electrical power system fault" are effectively distinguished from each other by further considering whether the directions of the voltage angle sudden-changes of respective phase are same or not as one of the criteria for determining whether the electrical islanding appears so as to achieve the improvement over the existing VVS-based method for islanding detection, the present disclosure is not limited thereto. The present disclosure can also realize an improvement over the SSV-based method for existing islanding detection without the need to determine the direction of the voltage angle sudden-change of each phase. FIG. 4 is a flowchart illustrating a method for electrical islanding detection according to another embodiment of the present disclosure.

As shown in FIG. 4, at the beginning of the method 40 for electrical islanding detection according to the embodiment of the present disclosure, first, at step S401, a three-phase voltage in an electrical power system is received. Similarly to step S201 in FIG. 2, for example, the three-phase voltage may be received at the secondary side of the voltage transformer in the electrical power system, that is, the three-phase voltage transformed by the voltage transformer is received. The method 40 for electrical islanding detection according to the embodiment of the present disclosure is also passive islanding detection and only requires three-phase voltage input, as a result a low cost is realized.

After step S401, steps S402-S405 as well as S409 and S410 are performed to determine whether the electrical power system enters into a three-phase voltage abnormal/ normal state. That is, by performing steps S402-S405 as well as S409 and S410, it is determined that the electrical power system enters into the three-phase voltage abnormal state if the three-phase voltage meets any one of the following conditions that: a zero sequence voltage is greater than a zero sequence voltage setting value; or a magnitude of any phase voltage is less than a voltage setting value; or the absolute value of the voltage angle sudden-change of any phase between adjacent voltage cycles is greater than an angle sudden-change setting value; it is determined that the electrical power system enters into the three-phase voltage normal state if none of the above conditions is met and a real-time measurement value of the rate of change of frequency is less than a setting value of the rate of change of frequency.

More specifically, after receiving the three-phase voltage of the electrical power system at step S401, the method 40 for electrical islanding detection may proceed to step S402 to determine whether the zero sequence voltage is greater than the zero sequence voltage setting value, and if the determination result in step S402 is "YES", then it is determined at step S405 that the electrical power system enters into the three-phase voltage abnormal state. If the determination result in step S402 is "NO", then the method 40 proceeds to step S403 to determine whether the magnitude of any phase voltage is less than the voltage setting value. If the determination result in step S403 is "YES", then it is determined at step S405 that the electrical power system enters into the three-phase voltage abnormal state. If the determination result in step S403 is "NO", then the method 40 proceeds to step S404 to determine whether the absolute value of the voltage angle sudden-change of any phase between adjacent voltage cycles is greater than the angle sudden-change setting value. If the determination result of step S404 is "YES", then it is determined at step S405 that the electrical power system enters into the three-phase voltage abnormal state. If the determination result in step S404 is "No", then the method 40 proceeds to step S409 to determine whether the real-time measurement value of the rate of change of frequency is less than the setting value of the rate of change of frequency. If the determination result in step S409 is "YES", then it is determined at step S410 that the electrical power system enters into the three-phase voltage normal state.

Similarly to FIG. 3, for example, it may be assumed that the zero sequence voltage setting value in step S402 is 10% of the voltage rating and the voltage setting value in step S403 is 80% of the voltage rating. However, the present invention is not limited thereto, those skilled in the art may set appropriate setting values according to the specific situations.

In addition, as described above, the angle sudden-change setting value in step S404 is a fixed value which can be preset according to a specific situation, and those skilled in the art can set an appropriate angle sudden-change setting value for determining whether the electrical power system enters into the three-phase voltage abnormal state according to practical requirements.

It should be noted that the execution order of the steps S402 to S404 is not limited to the order shown in FIG. 4, and steps S402 to S404 may be performed in any suitable orders. As long as the determination result of any of them is "YES", it is considered that the electrical power system enters into three-phase voltage abnormal state.

It should be understood that, similarly to FIG. 3, although not shown in FIG. 4, if the determination result at step S409 is "NO", that is, when the determination condition of the three-phase voltage normal state is not satisfied, the current state can be maintained. For example, if it has been previously determined that the electrical power system enters into the three-phase voltage abnormal state, then when the determination result at step S409 is "NO", it is considered that the electrical power system is still in the three-phase voltage abnormal state, and it is determined that the electrical power system enters into the three-phase voltage normal state when the judgment result at step S409 is "YES". For another example, if it has been previously determined that the electrical power system enters into the three-phase voltage normal state, then when the determination result at step S409 is "NO", it is considered that the electrical power system is still in the three-phase voltage normal state.

After determining that the electrical power system enters into the three-phase voltage abnormal state at step S405, the method 40 for electrical islanding detection proceeds to step S406. At step S406, an accumulated voltage angle change of the three-phase voltage is calculated based on the real-time frequency measurement value.

Specifically, the voltage angle sudden-change of each phase that is calculated based on the zero-crossing detection or Fourier Transform in the above described method 20 for electrical islanding detection is an instantaneous value, while in the method 40 for electrical islanding detection, it is not calculated for each phase of the three-phase voltage, instead, an accumulated value of the total voltage angle changes of the three-phase voltage is calculated based on the real-time frequency measurement value. For example, an equation for calculating the accumulated voltage angle change may be as follows.

$$\Sigma Ang(t) = 2\pi \cdot \int [f(t) - f(t_0)] dt$$

Here, $f(t_0)$ is the voltage frequency value at the time when it is determined that the electrical power system enters into the three-phase voltage abnormal state. $Ang(t)$ is the instantaneous value of the voltage angle change at time t, and ΣAng (t) represents the accumulated voltage angle change of the three-phase voltage.

After calculating the accumulated voltage angle change of the three-phase voltage at step S406, the method 40 for electrical islanding detection proceeds to step S407. At step S407, it is determined whether the accumulated voltage angle change is greater than an accumulated angle change setting value. If it is determined at step S407 that the accumulated voltage angle change is greater than the accumulated angle change setting value, then it is further determined at step S408 that the electrical islanding appears.

Specifically, as described before, the accumulated angle change setting value is a fixed value which is preset according to a specific situation, and those skilled in the art can set an appropriate accumulated angle change setting value for determining whether or not the electrical islanding appears according to practical requirements. Here, the accumulated angle change setting value is different from the aforementioned first or second angle sudden-change setting value. The former is an accumulated value and the latter is an instantaneous value.

After determining that the electrical power system enters into the three-phase voltage normal state at step S410, the method 40 for electrical islanding detection proceeds to step S411. At step S411, the calculation of the accumulated voltage angle change is ended.

Specifically, in the method 40 for electrical islanding detection of the present disclosure, the three-phase voltage state of the electrical power system is first determined. If the electrical power system enters into the three-phase voltage abnormal state, it is began to calculate the accumulated voltage angle change for the three-phase voltage, and the calculated accumulated voltage angle change is compared with the accumulated angle change setting value to determine whether the electrical islanding appears. If the electrical power system enters into the three-phase voltage normal state, the calculation of the accumulated voltage angle change of the three-phase voltage is stopped, that is, in the three-phase voltage normal state, it is impossible for the electrical islanding to appear in the electrical power system, so there is no need to carry out corresponding calculations and determinations.

After step S408 or S411, the electrical islanding detection method 40 ends.

Alternatively, in the method 40 for electrical islanding detection according to the embodiment of the present disclosure, the three-phase voltage is three phase-to-phase voltages. However, the present invention is not limited thereto, and the present invention may also employ a three-phase-to-ground voltage. However, it is preferable to employ three phase-to-phase voltages than to employ a three-phase-to-ground voltage.

In the method 40 for electrical islanding detection, by adopting a "three-phase voltage abnormal state" to start a calculation of the accumulated angle changes of the three-phase voltage and adopting a "three-phase voltage normal state" to stop the calculation, the present disclosure, compared with the conventional VVS-based method for islanding detection, can effectively improve the sensitivity of islanding detection and ensure reliability.

Figure 5:
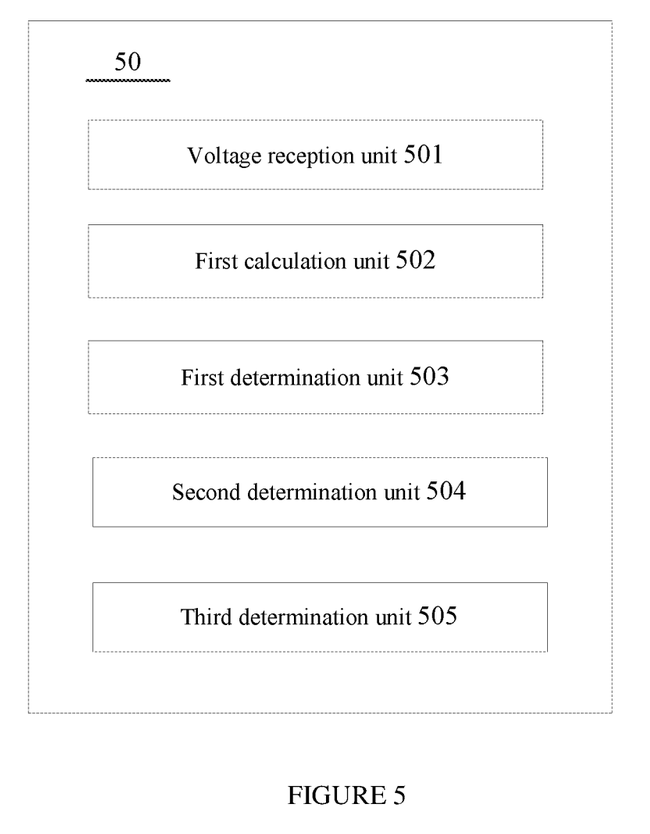
FIG. 5 is a block diagram illustrating a configuration of main units of an apparatus for electrical islanding detection according to an embodiment of the present disclosure.

The methods 20 and 40 for electrical islanding detection according to embodiments of the present disclosure are described above with reference to FIGS. 1-4. In the following, an apparatus 50 for electrical islanding detection according to another embodiment of the present disclosure will be described with reference to FIG. 5. FIG. 5 is a block diagram illustrating configuration of main units of an apparatus 50 for electrical islanding detection according to an embodiment of the present disclosure. Specifically, the apparatus 50 for electrical islanding detection may be connected in the electrical power system, for example, at the secondary side of the voltage transformer, in order to detect the electrical islanding in the electrical power system.

As shown in FIG. 5, the apparatus 50 for electrical islanding detection according to the embodiment of the present disclosure may include: a voltage reception unit 501, a first calculation unit 502, a first determination unit 503, a second determination unit 504 and a third determination unit 505.

The voltage reception unit 501 receives a three-phase voltage in an electrical power system. The first calculation unit 502 calculates, for the three-phase voltage, the voltage angle sudden-change of each phase respectively. The first determination unit 503 determines whether the absolute value of the voltage angle sudden-change of each phase is greater than a first angle sudden-change setting value. If the first determination unit 503 determines that the absolute value of the voltage angle sudden-change of each phase is greater than the first angle sudden-change setting value, the second determination unit 504 determines whether the directions of the voltage angle sudden-changes of the three phases are the same. And, if the second determination unit 504 determines that the directions of the voltage angle sudden-changes of the three phases are the same, the third determination unit 505 determines that the electrical islanding appears.

Alternatively, although not shown in FIG. 5, the second determination unit 504 includes a second sub-determination unit which determines whether the absolute value of the average of the voltage angle sudden-changes of the three phases is greater than the first angle sudden-change setting value. And, the third determination unit 505 determines that the electrical islanding appears if the second sub-determination unit determines that the absolute value of the average of the voltage angle sudden-changes of the three phases is greater than the first angle sudden-change setting value.

Alternatively, although not shown in FIG. 5, the first calculation unit 502 includes a first sub-calculation unit for calculating a voltage angle sudden-change of each phase between adjacent voltage cycles respectively based on a zero-crossing detection.

Alternatively, although not shown in FIG. 5, the second determination unit 503 includes a second sub-determination unit which determines whether the signs of the voltage angle sudden-changes of the three phases are the same. And, the third determination unit 505 determines that the electrical islanding appears if the second sub-determination unit determines that the signs of the voltage angle sudden-changes of the three phases are the same.

Alternatively, although not shown in FIG. 5, the apparatus 50 for electrical islanding detection further includes a fourth determination unit which determines that the electrical power system enters into a three-phase voltage abnormal state if the three-phase voltage meets any one of the following conditions that: a zero sequence voltage is greater than a zero sequence voltage setting value; or a magnitude of any phase voltage is less than a voltage setting value; or the absolute value of the voltage angle sudden-change of any phase between adjacent voltage cycles is greater than a second angle sudden-change setting value, wherein the second angle sudden-change setting value is less than the first angle sudden-change setting value; and determines that the electrical power system enters into a three-phase voltage normal state if none of the above conditions is met and a real-time measurement value of the rate of change of frequency is less than a setting value of the rate of change of frequency.

Alternatively, although not shown in FIG. 5, the first calculation unit 502 includes a first sub-calculation unit for calculating a voltage phase angle of each voltage cycle using the Fourier Transform, and calculating a voltage angle sudden-change of each phase based on a last stable angle. And, the last stable angle is updated with the latest calculated voltage phase angle in the three-phase voltage normal state, and the last stable angle is kept unchanged in the three-phase voltage abnormal state.

Alternatively, in the apparatus 50 for electrical islanding detection, when the time period that the last stable angle is kept unchanged in the three-phase voltage abnormal state is greater than the effective time limit setting value of the last stable angle, the apparatus 50 for electrical islanding detection is blocked until the electrical power system enters into the three-phase voltage normal state.

Alternatively, in the apparatus 50 for electrical islanding detection, the three-phase voltage is three phase-to-phase voltages.

The configuration and specific operations of each unit of the apparatus 50 for electrical islanding detection have been described in detail with reference to the method 20 for electrical islanding detection as shown in FIGS. 1-3, and will not be repeated here.

In the apparatus 50 for electrical islanding detection, by further considering whether the directions of the voltage angle sudden-changes of the three phases are the same or not as one of the criteria for determining whether the electrical islanding appears, the present disclosure, compared with the conventional VVS-based method for islanding detection, can detect the electrical islanding more sensitively and accurately while effectively reduce the possibility that mal-operations occur in the case that the electrical power system fails.

Alternatively, the functions and operation modes of the respective units in the apparatus 50 for electrical islanding detection shown in FIG. 5 are not limited to the above, and they may also be implemented according to the method 40 for electrical islanding detection as described above with reference to FIG. 4.

Specifically, the voltage reception unit 501 receives a three-phase voltage in an electrical power system. The first determination unit 503 determines that the electrical power system enters into a three-phase voltage abnormal state if the three-phase voltage meets any one of the following conditions that: a zero sequence voltage is greater than a zero sequence voltage setting value; or a magnitude of any phase voltage is less than a voltage setting value; or the absolute value of the voltage angle sudden-change of any phase between adjacent voltage cycles is greater than an angle sudden-change setting value; determines that the electrical power system enters into a three-phase voltage normal state if none of the above conditions is met and a real-time measurement value of the rate of change of frequency is less than a setting value of the rate of change of frequency. The first calculation unit 502 calculates, when the electrical power system enters into the three-phase voltage abnormal state, an accumulated voltage angle change of the three-phase voltage based on the real-time frequency measurement value. The second determination unit 504 determines whether the accumulated voltage angle change is greater than an accumulated angle change setting value. And, the third determination unit 504 determines that the electrical islanding appears if the second determination unit 504 determines that the accumulated voltage angle change is greater than the accumulated angle change setting value. When the electrical power system enters into the three-phase voltage normal state, the first determination unit 502 stops the calculation of the accumulated voltage angle change.

Therefore, in the alternative apparatus 50 for electrical islanding detection, by adopting the "three-phase voltage abnormal state" to start the calculation of the accumulated angle change of the three-phase voltage and adopting the "three-phase voltage normal state" to end the calculation, the present invention, when compared with the conventional VVS-based method for islanding detection, can effectively improve the sensitivity of islanding detection and ensure reliability.

In the above, the method and apparatus for electrical islanding detection according to the embodiments of the present invention have been described with reference to FIGS. 1-5.

It should be noted that, in this specification, the terms "include", "comprise" or any other variations thereof are intended to cover non-exclusive inclusions so that a procedure, method, article, or device that includes a series of elements includes not only those elements, but also includes other elements that are not explicitly listed, or elements that are inherent to such a procedure, method, article, or device. With no more limitation, the element defined by the sentence "include a . . . " does not exclude that there is another same element in the procedure, method, article, or device including the element.

Finally, it should also be noted that the above-described series of processes include not only processes performed chronologically in the order as described herein but also include processes performed in parallel or individually instead of chronologically.

With the above description of the embodiments, those skilled in the art can clearly understand that the present disclosure can be implemented by software in combination with necessary hardware platform, and of course the present disclosure may also be fully implemented by hardware. Based on such understanding, a part of or full part of the technical solution of the invention which contributes to the prior art may be embodied in form of a software product. This computer software product can be stored in a storage medium, such as a ROM/RAM, a disk, an optical disc and the like, and include multiple instructions to cause a computer device (possibly a personal computer, a server or a network device, etc.) to implement the embodiments of the disclosure or method described by some parts of the embodiments.

In the embodiments of the present disclosure, the module/unit may be realized by software so as to be executed by various processors. For example, an identified executable code module may comprise one or more physical or logical blocks of the computer instructions, which may, for example, be constructed as an object, a process, or a function. Nevertheless, the executable codes of the identified module are not necessary to be located together physically, and may comprise different instructions stored at different locations, which may construct a module and achieve the predetermined purpose of the module when being combined together logically.

When the module is realized by software, considering the existing hardware manufacture process, those skilled in the art may implement its function by corresponding hardware circuits comprising the normal VLSI circuit or the existing semiconductor such as a logical chip or a transistor, or other discrete elements, regardless of cost. The module may also be implemented by a programmable hardware device, such as a field programmable gate array, a programmable array logic, or a programmable logical device, etc.

The present disclosure has been described above in detail. The principle and implementation of the present disclosure is described by way of example in the description. The above description of the embodiments is only for facilitating understanding of the method and the idea of the present disclosure. It should be noted that various modifications and alternations may be made by those of ordinary skill in the art without departing from the principle of the present disclosure, based on the teaching of the present disclosure. In summary, the description shall not be construed as a limitation to the scope of the present disclosure.

What is claimed is:

1. A method for electrical islanding detection, comprising:
   receiving a three-phase voltage in an electrical power system;
   for the three-phase voltage, calculating a voltage angle sudden-change of each phase, respectively;
   determining whether an absolute value of the voltage angle sudden-change of each phase is greater than a first angle sudden-change setting value;
   determining whether directions of the voltage angle sudden-changes of the three phases are the same if the absolute value of the voltage angle sudden-change of each phase is greater than the first angle sudden-change setting value; and
   determining that the electrical islanding appears if the directions of the voltage angle sudden-changes of the three phases are the same.

2. The method for electrical islanding detection according to claim 1, wherein determining whether directions of the voltage angle sudden-changes of the three phases are the same comprises:
   determining whether signs of the voltage angle sudden-changes of the three phases are the same, and wherein
   determining that the electrical islanding appears if the signs of the voltage angle sudden-changes of the three phases are the same.

3. The method for electrical islanding detection according to claim 2, after receiving the three-phase voltage in the electrical power system, the method further comprising:
   determining that the electrical power system enters into a three-phase voltage abnormal state if the three-phase voltage meets any one of the following conditions comprising: a zero sequence voltage is greater than a zero sequence voltage setting value, or a magnitude of any phase voltage is less than a voltage setting value, or an absolute value of the voltage angle sudden-change of any phase between adjacent voltage cycles is greater than a second angle sudden-change setting value, wherein the second angle sudden-change setting value is less than the first angle sudden-change setting value; and
   determining that the electrical power system enters into a three-phase voltage normal state if none of the above conditions is met and a real-time measurement value of the rate of change of frequency is less than a setting value of the rate of change of frequency.

4. The method for electrical islanding detection according to claim 3, after receiving the three-phase voltage in the electrical power system, the method further comprising:
   calculating the voltage phase angle of each voltage cycle using the Fourier Transform, wherein calculating the voltage angle sudden-change of each phase respectively comprises:
   calculating the voltage angle sudden-change of each phase based on a last stable angle, and wherein
   the last stable angle is updated with the latest calculated voltage phase angle in the three-phase voltage normal state, and the last stable angle is kept unchanged in the three-phase voltage abnormal state.

5. The method for electrical islanding detection according to claim 4, wherein when the time period during which the latest stable angle is kept unchanged in the three-phase voltage abnormal state is greater than an effective time limit setting value of the latest stable angle, the method for electrical islanding detection is blocked until the electrical power system enters into the three-phase voltage normal state.

6. The method for electrical islanding detection according to claim 1, wherein determining whether directions of the voltage angle sudden-change of the three phases are the same comprises:
   determining whether an absolute value of the average of the voltage angle sudden-changes of the three phases is greater than the first angle sudden-change setting value, and wherein
   determining that the electrical islanding appears if the absolute value of the average of the voltage angle sudden-changes of the three phases is greater than the first angle sudden-change setting value.

7. The method for electrical islanding detection according to claim 6, wherein calculating the voltage angle sudden-change of each phase respectively comprises:
   calculating the voltage angle sudden-change of each phase between adjacent voltage cycles respectively based on a zero-crossing detection.

8. The method for electrical islanding detection according to claim 1, wherein the three-phase voltage is three phase-to-phase voltages.

9. An apparatus for electrical islanding detection, comprising:
   a voltage reception unit for receiving a three-phase voltage in an electrical power system;
   a first calculation unit for, for the three-phase voltage, calculating a voltage angle sudden-change of each phase, respectively;
   a first determination unit for determining whether an absolute value of the voltage angle sudden-change of each phase is greater than a first angle sudden-change setting value;
   a second determination unit for determining whether directions of the voltage angle sudden-changes of the three phases are the same if the absolute value of the voltage angle sudden-change of each phase is greater than the first angle sudden-change setting value; and
   a third determination unit for determining that the electrical islanding appears if the directions of the voltage angle sudden-changes of the three phase are the same.

10. The apparatus for electrical islanding detection according to claim 9, wherein the second determination unit comprises a second sub-determination unit which determines whether the signs of the voltage angle sudden-changes of the three phases are the same, and
   wherein the third determination unit determines that the electrical islanding appears if the second sub-determination unit determines that the signs of the voltage angle sudden-changes of the three phases are the same.

11. The apparatus for electrical islanding detection according to claim 10, further comprising a fourth determination unit which
  determines that the electrical power system enters into a three-phase voltage abnormal state if the three-phase voltage meets any one of the following conditions comprising:
    a zero sequence voltage is greater than a zero sequence voltage setting value; or
    a magnitude of any voltage phase is less than a voltage setting value; or
    an absolute value of a voltage angle sudden-change of any phase between adjacent voltage cycles is greater than a second angle sudden-change setting value, wherein the second angle sudden-change setting value is less than the first angle sudden-change setting value; and
  determines that the electrical power system enters into a three-phase voltage normal state if none of the above conditions is met and a real-time measurement value of the rate of change of frequency is less than a setting value of the rate of change of frequency.

12. The apparatus for electrical islanding detection according to claim 11, wherein the first calculation unit comprises:
  a first sub-calculation unit for calculating the voltage phase angle of each voltage cycle using the Fourier Transform, and calculating the voltage angle sudden-change of each phase based on a last stable angle, and
  wherein the last stable angle is updated with the latest calculated voltage phase angle in the three-phase voltage normal state, and the last stable angle is kept unchanged in the three-phase voltage abnormal state.

13. The apparatus for electrical islanding detection according to claim 12, wherein when the time period during which the latest stable angle is kept unchanged in the three-phase voltage abnormal state is greater than an effective time limit setting value of the latest stable angle, the apparatus for electrical islanding detection is blocked until the electrical power system enters into the three-phase voltage normal state.

14. The apparatus for electrical islanding detection according to claim 9, wherein the second determination unit comprises a second sub-determination unit which determines whether an absolute value of the average of the voltage angle sudden-changes of the three phases is greater than the first angle sudden-change setting value, and
  wherein the third determination unit determines that the electrical islanding appears if the second sub-determination unit determines that the absolute value of the average of the voltage angle sudden-changes of the three phases is greater than the first angle sudden-change setting value.

15. The apparatus for electrical islanding detection according to claim 14, wherein the first determination unit comprises:
  a first sub-determination unit for calculating the voltage angle sudden-change of each phase between adjacent voltage cycles respectively based on a zero-crossing detection.

16. The apparatus for electrical islanding detection according to claim 9, wherein the three-phase voltage is three phase-to-phase voltages.

17. A method for electrical islanding detection method, comprising:
  receiving a three-phase voltage in an electrical power system;
  determining that an electrical power system enters into a three-phase voltage abnormal state if the three-phase voltage meets any one of the following conditions comprising:
    a zero sequence voltage is greater than a zero sequence voltage setting value; or
    a magnitude of any phase voltage is less than a voltage setting value; or
    an absolute value of a voltage angle sudden-change of any phase between adjacent voltage cycles is greater than an angle sudden-change setting value;
  determining that the electrical power system enters into a three-phase voltage normal state if none of the above conditions is met and a real-time measurement value of the rate of change of frequency is less than a setting value of the rate of change of frequency;
  when the electrical power system enters into the three-phase voltage abnormal state, calculating an accumulated voltage angle change of the three-phase voltage based on the real-time frequency measurement value;
  determining whether the accumulated voltage angle change is greater than an accumulated angle change setting value; and
  determining that the electrical islanding appears if the accumulated voltage angle change is greater than the accumulated angle change setting value,
  wherein when the electrical power system enters into the three-phase voltage normal state, the calculation of the accumulated voltage angle change is stopped.

18. The method for electrical islanding detection according to claim 17, wherein the three-phase voltage is three phase-to-phase voltages.

19. An apparatus for electrical islanding detection, comprising:
  a voltage reception unit for receiving a three-phase voltage in an electrical power system;
  a first determination unit for determining that the electrical power system enters into a three-phase voltage abnormal state if the three-phase voltage meets any one of the following conditions comprising:
    a zero sequence voltage is greater than a zero sequence voltage setting value; or
    a magnitude of any phase voltage is less than a voltage setting value; or
    an absolute value of a voltage angle sudden-change of any phase between adjacent voltage cycles is greater than an angle sudden-change setting value;
    determining that the electrical power system enters into a three-phase voltage normal state if none of the above conditions is met and a real-time measurement value of the rate of change of frequency is less than a setting value of the rate of change of frequency;
  a calculation unit for, when the electrical power system enters into the three-phase voltage abnormal state, calculating an accumulated voltage angle change of the three-phase voltage based on the real-time frequency measurement value;
  a second determination unit for determining whether the accumulated voltage angle change is greater than an accumulated angle change setting value; and
  a third determination unit for determining that the electrical islanding appears if the accumulated voltage angle change is greater than the accumulated angle change setting value, wherein when the electrical power system enters into the three-phase voltage normal state, the calculation unit stops the calculation of the accumulated voltage angle change.

20. The apparatus for electrical islanding detection according to claim 19, wherein the three-phase voltage is three phase-to-phase voltages.

* * * * *